(12) United States Patent
Lee

(10) Patent No.: US 7,170,325 B2
(45) Date of Patent: Jan. 30, 2007

(54) CIRCUIT FOR CONTROLLING A DELAY TIME OF INPUT PULSE AND METHOD OF CONTROLLING THE SAME

(75) Inventor: Jeong Woo Lee, Seoul (KR)

(73) Assignee: Hynix Semiconductor Inc., Kyungki-Do (KR)

(*) Notice: Subject to any disclaimer, the term of this patent is extended or adjusted under 35 U.S.C. 154(b) by 0 days.

(21) Appl. No.: 10/879,835

(22) Filed: Jun. 29, 2004

(65) Prior Publication Data
US 2005/0127969 A1    Jun. 16, 2005

(30) Foreign Application Priority Data
Dec. 10, 2003    (KR)    ........................ 10-2003-0089324

(51) Int. Cl.
*H03K 5/04* (2006.01)
(52) U.S. Cl. ........................................ 327/172; 327/175
(58) Field of Classification Search ........ 327/172–175, 327/165, 166
See application file for complete search history.

(56) References Cited

U.S. PATENT DOCUMENTS

| | | | | |
|---|---|---|---|---|
| 4,527,080 A | * | 7/1985 | Zweig | 327/12 |
| 4,979,194 A | * | 12/1990 | Kawano | 377/55 |
| 5,603,109 A | * | 2/1997 | Feeney | 455/192.2 |
| 5,740,123 A | * | 4/1998 | Uchida | 365/233 |
| 5,757,218 A | * | 5/1998 | Blum | 327/175 |
| 6,028,461 A | * | 2/2000 | Kobayashi | 327/155 |
| 6,297,680 B1 | * | 10/2001 | Kondo | 327/278 |
| 6,469,563 B2 | * | 10/2002 | Heyne et al. | 327/362 |
| 6,470,060 B1 | * | 10/2002 | Harrison | 375/374 |
| 6,639,441 B2 | * | 10/2003 | Ono et al. | 327/175 |
| 6,803,826 B2 | * | 10/2004 | Gomm et al. | 331/11 |
| 6,833,744 B2 | * | 12/2004 | Yi | 327/175 |
| 6,847,241 B1 | * | 1/2005 | Nguyen et al. | 327/158 |
| 7,030,671 B2 | * | 4/2006 | Park | 327/172 |

FOREIGN PATENT DOCUMENTS

JP    11-024783    1/1999

* cited by examiner

*Primary Examiner*—Timothy P. Callahan
*Assistant Examiner*—Hai L. Nguyen
(74) *Attorney, Agent, or Firm*—Marshall, Gerstein & Borun LLP

(57) ABSTRACT

Provided is directed to a circuit of controlling a pulse width and a method of controlling the same, which can remove failure possible to be generated during operations of a DRAM or a DDR in a high frequency by guaranteeing read and write operations of a stabilized data and a precharging time of a local input/output line, in response to identically adjust widths of a pulse synchronized with a clock and a target pulse, by means of comprising: a pulse comparator for comparing a target pulse with a pulse synchronized with a clock; a counter pulse generation circuit for generating a counter pulse according to an output of the comparator; a pulse counter circuit for outputting a plurality of pulse counter signals, sequentially, according to the counter pulse; and a pulse delay circuit for controlling the pulse width synchronized with the clock according to the plurality of pulse counter signals.

21 Claims, 5 Drawing Sheets

CIRCUIT FOR CONTROLLING A DELAY TIME OF INPUT PULSE AND METHOD OF CONTROLLING THE SAME

This application relies for priority upon Korean Patent Application No. 2003-0089324 filed on Dec. 10, 2003, the contents of which are herein incorporated by reference in their entirety.

BACKGROUND

1. Field of the Invention

The present invention relates to a circuit of controlling a pulse width, and more particularly to, a circuit for controlling a pulse width of a column address select signal.

2. Discussion of Related Art

A high speed DRAM or DDR has been recently used in a graphic field. Operations of those devices are remarkably affected by a pulse width, especially by a column address select signal.

The DRAM for a graphic operating in various frequency domains of low frequency to high frequency is operated in a wide frequency domain, which occurs many problems. Especially, in case of a column address select signal, each of the signals should have an appropriate pulse width for each operation frequency, to be stable for read and write operations of a DRAM data. Accordingly, it is important for the column address select signal to have an appropriate pulse width according to the operation frequency. In the conventional technique, the pulse width of the column address select signal is preset a predetermined value or controlled by an external clock.

A method of setting the pulse width of the column address select signal as a predetermined value is to generate a constant pulse width regardless of tCK, namely a frequency. In this case, although the frequency is risen, which means the tCK is decreased, the column address select signal has a constant pulse width. As a result, during read and write operations of the DRAM, a period activating a local input/output line for transferring an output signal of a bitline sense amplifier to an input/output sense amplifier is wider, but a precharge period is narrower. Accordingly, if a read or a write operation command is inputted sequentially in a disprecharge state, other data (can be error) are available to be read or written, degrading reliability of the data.

In addition, in a method for controlling the column address select signal by the external clock, the tCK is decreased in a high frequency, which results to narrow the activation period for the local input/output line. As a result, when the read and write operations are performed, especially the read operations is performed, ΔV of the local input/output line is reduced, thereby disadvantageous to use a wrong data in the input/output sense amplifier.

SUMMARY OF THE INVENTION

The present invention is directed to a circuit of controlling a pulse width and a method which can solve those problems by setting a target pulse width in an optional frequency, counting until a pulse width synchronized with a clock and the target pulse width become identical each other, and then identifying the pulse width synchronized with the clock to the target pulse width with a delay as much as the counted time.

The present invention is also directed to provide a circuit of controlling a pulse width which can solve those problems by generating a variable pulse width according to an operation frequency.

Here, the circuit of controlling a pulse width according to the present invention includes: a pulse comparator for comparing a target pulse with a pulse synchronized with a clock; a counter pulse generation circuit for generating a counter pulse according to an output of the comparator; a pulse counter circuit for outputting a plurality of pulse counter signals, sequentially, according to the counter pulse; and a pulse width adjustment circuit for controlling a pulse width synchronized with the clock according to the plurality of pulse counter signals.

The pulse comparator is comprised of a detection unit for detecting whether the target pulse is identical to the pulse synchronized with the clock or not, and a driver for generating a logical signal according to an output of the detection unit.

The detection unit is an exclusive OR gate.

The detection unit includes a latch for latching an output of the exclusive OR gate.

The driver includes: a NAND gate for inputting a potential in accordance with the output of the detection unit and a supply voltage; a first transmission gate for transferring an output of the NAND gate according to the output of the detection unit; and a second transmission gate for transferring the output of the detection unit according to the output of the detection unit.

The counter pulse generation circuit includes: a delay means for delaying an output of the pulse comparator; and a NAND gate for generating a counter pulse by inputting the output of the pulse comparator and an output of the delay means.

The pulse counter circuit including a plurality of shifters outputs a pulse counter signal without passing through shifters at the beginning state, and also outputs a plurality of pulse counter signals, sequentially, by driving the plurality of shifters in sequence whenever the counter pulse is enabled.

The pulse counter circuit feedbacks the last pulse counter signal outputted through the last stage shifter into an input terminal of the pulse counter.

The pulse counter circuit includes: a first transmission gate for transferring a potential of an input node according to the counter pulse; a NOR gate for inputting the signal transferred through the counter pulse and the first transmission gate; a first latch for outputting the pulse counter signal by latching an output signal of the NOR gate; a plurality of shifters shifting the pulse counter signal outputted from the first latch, and outputting a plurality of pulse counter signal, sequentially, by driving in sequence whenever the counter pulse is enabled; a second transmission gate for transferring the last pulse counter signal outputted from the last shifter according to the counter pulse; and a second latch for deciding a potential of an input node by latching the pulse counter signal transferred through the second transmission gate.

The shifters include: a first transmission gate for transferring the pulse counter signal according to the counter pulse; a latch for latching the signal transferred through the first transmission gate; a second transmission gate for transferring an output signal of the latch according to the counter pulse; and a NAND gate for inputting the signal transferred through the counter pulse and the second transmission gate.

The pulse width adjustment circuit includes a plurality of delay means for delaying the output signal of the latch, and a plurality of switching means for setting a delay time by being connected to output terminals of the plurality of delay means, respectively, and driven according to the pulse counter signal.

The switching means include a plurality of inverters for inverting the plurality of pulse counter signals, respectively, and a plurality of transmission gates driven by the plurality of pulse counter signals and output signals of the plurality of inverters, respectively.

On the other hand, a method of controlling the pulse width according to the present invention includes the steps of: setting a proper width of a target pulse in an optional frequency; generating a comparison signal by comparing the target pulse with a pulse synchronized with a predetermined clock; generating a predetermined counter pulse by using the comparison signal; generating a plurality of pulse counter signals in sequence according to the counter pulse; and adjusting a pulse width synchronized with the clock by setting a different delay path according to the pulse counter signals.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be explained of the present invention with the accompanying drawings in detail.

Figure 1:
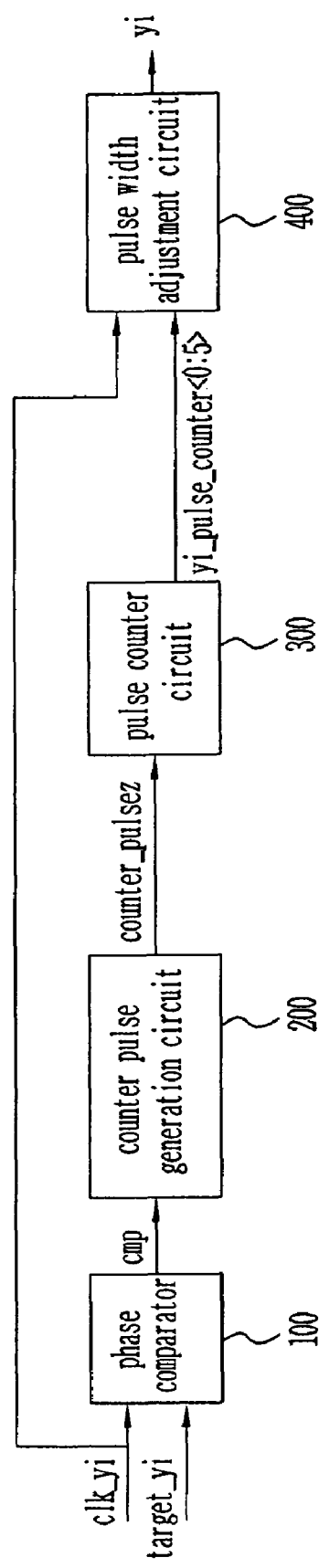
FIG. 1 is a block diagram illustrating a scheme of a circuit of controlling a pulse width according to an embodiment of the present invention.

FIG. 1 is a block diagram illustrating a circuit of controlling a pulse width of a column address select signal in accordance with an embodiment of the present invention.

A phase comparator 100 outputs a comparison signal cmp by comparing a pulse clk_yi synchronized with a clock with a target pulse target_yi setting a proper pulse width in an optional frequency. When the pulse clk_yi synchronized with the clock is identical to the target pulse target_yi, that is, the two signals have the same phases, the phase comparator 100 outputs the comparison signal cmp in a low state, while outputting the comparison signal cmp in a high state when the two signals have the different phases.

A counter pulse generation circuit 200 generates a predetermined counter pulse counter_pulsez, when the pulse clk_yi synchronized with the clock has a different phase from a pulse of the target pulse target_yi, by inputting the comparison signal cmp outputted from the phase comparator 100.

A pulse counter circuit 300 outputs a pulse counter signal yi_pulse_counter<0:5> from the plurality of shifters, sequentially, whenever the counter pulse counter_pulsez is enabled.

The width adjustment delay circuit 400 controls the pulse width of the pulse clk_yi synchronized with the clock by deciding a delay path according to the pulse counter signal yi_pulse_counter<0:5>.

Figure 2:
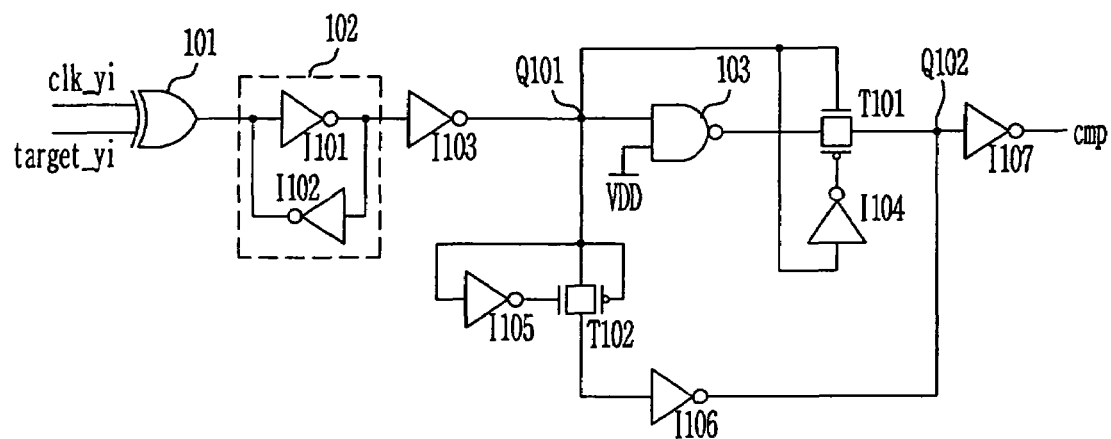
FIG. 2 is a circuit diagram of a pulse comparator comprising a circuit of controlling a pulse width according to an embodiment of the present invention.

FIG. 2 is a circuit diagram comprising the circuit of controlling the pulse width in accordance with the present invention, which will be explained as follows.

An exclusive OR gate 101 compares two pulse widths by inputting the pulse clk_yi synchronized with the clock and the target pulse target_yi. An output signal of the exclusive OR gate 101 is latched by a latch 102 comprised of a first inverter I101 and a second inverter I102. The data latched in the latch 102 is inverted by a third inverter I103, to become a potential of a first node Q101. The potential of the first node Q101 is inputted to a NAND gate 103 with a supply voltage VDD. A first transmission gate T101 is driven by the potential of the first node Q101 and a signal, an inverted signal of the potential of the first node Q101 by the fourth inverter I104. An output signal of the NAND gate 103 is transferred to a second node Q102 through the first transmission gate T101. On the other hand, the second transmission gate T102 is driven by the potential of the first node Q101 and a signal, an inverted signal of the potential of the first node Q101 by a fifth inverter I105. Data transferred through the second transmission gate T102 is inverted by a sixth inverter I106, to become a potential of the second node Q102. The potential of the second node Q102 is outputted through seventh inverter I107, to become the comparison signal cmp.

It will be described about a method of driving the pulse comparator in accordance with the present invention constructed as above.

The exclusive OR gate 101 compares the pulse clk_yi synchronized with the clock with the target pulse target_yi. If the pulse clk_yi synchronized with the clock and the target pulse target_yi have the same pulse width and then the two signals have the same phases, the exclusive OR gate 101 outputs a low state signal, while outputting a high state signal if the two signals have different pulse widths and then have different phases.

If the exclusive OR gate outputs a low state signal by inputting the pulse clk_yi synchronized with the clock and the target pulse target_yi with the same phases, the signal is latched to the latch 102 and the latch 102 outputs a high state signal. The output signal of the latch 102 maintaining a high state is inverted by the third inverter I103. As a result, the first node Q101 becomes a low state. The potential of the first node Q101 maintaining a low state is inputted to the NAND gate 103 with the supply voltage VDD and the NAND gate 103 outputs a high state signal. On the other hand, the potential of the first node Q101 maintaining a low state is inverted by the fourth inverter I104 to a high state, and the first transmission gate T101 driven by the potential of the first node Q101 and an output signal of the fourth inverter I104 is turned off. Accordingly, the output signal of the NAND gate 103 maintaining a high state is not transferred. However, the potential of the first node Q101 maintaining a low state is inverted to a high state through the fifth inverter I105 and the second transmission gate T102 driven by the potential of the first node Q101 and an output signal of the fifth inverter I105 is turned on. Therefore, the potential of the first node maintaining a low state is transferred to the second node Q102 in a high state through the second transmission gate T102 and the sixth inverter I106. The potential of the second node I102 maintaining a high state is outputted as the comparison signal cmp of low state through a seventh inverter I107.

If the exclusive OR gate 101 outputs a high state signal by inputting the pulse clk_yi synchronized with the clock and the target pulse target_yi with different phases, the signal is latched to the latch 102 and the latch 102 outputs a low state signal. The output signal of the latch 102 maintaining a low state is inverted through the third inverter I103. As a result, the first node becomes a high state. The potential of the first node Q101 maintaining a high state is inputted to the NAND gate 103 with the supply voltage VDD and the NAND gate 103 outputs a low state signal. On the other hand, the potential of the first node Q101 maintaining a high state is inverted to a low state through the fourth inverter I104, and the first transmission gate T101 driven by the potential of the first node Q101 and an output signal of the fourth inverter I104 is turned on. Accordingly, the output signal of the NAND gate maintaining a low state is transferred to the second node Q102. The potential of the second node Q102 maintaining a low state is outputted as the comparison signal cmp of a high state through the seventh inverter I107. However, the potential of the first node Q101 maintaining a high state is inverted to a low state through the fifth inverter I105 and the second transmission gate T102 driven by the potential of the first node Q101 and the output signal of the fifth inverter I105 is turned off. Accordingly, the potential of the first node Q101 maintaining a high state is not transferred via the second transmission gate T102.

As aforementioned, if the pulse clk_yi synchronized with the clock and the target pulse target_yi have the same phases, the clock comparator in accordance with the present invention outputs the comparison signal cmp of a low state, while outputting the comparison signal cmp of a high state if with different phases.

Figure 3:
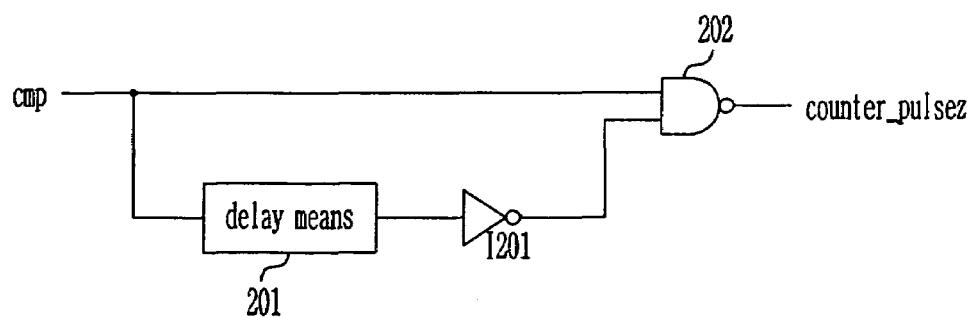
FIG. 3 is a circuit diagram of a counter pulse generation circuit comprising a circuit of controlling a pulse width according to an embodiment of the present invention.

FIG. 3 is a circuit diagram illustrating a counter pulse generation circuit comprising the circuit of controlling a pulse width in accordance with the present invention. The pulse generation circuit generates a counter pulse as much as a delay time of a delay means, by inputting the comparison signal cmp outputted from the clock comparator, if the pulse clk_yi synchronized with the clock and the target pulse target_yi have the different phases.

The counter pulse generation circuit according to the present invention is comprised of: a delay means 201 for delaying the comparison signal cmp; an inverter I201 for inverting an output signal of the delay means 201; a NAND gate 202 for inputting a signal delayed by the comparison signal cmp, the delay means 201, and the inverter I201. An output signal of the NAND gate becomes a counter pulse bar counter_pulsez.

The counter pulse generation circuit according to the present invention constructed as above outputs a counter pulse counter_pulsez of a high state, if the comparison signal is a low state, that is, the pulse clk_yi synchronized with the clock and the target pulse target_yi have the same phases, while outputting a counter pulse counter_pulsez of a low state, when the comparison signal cmp is a high state, that is, the pulse clk_yi synchronized with the clock and the target pulse target_yi have the different phases.

Figure 4:
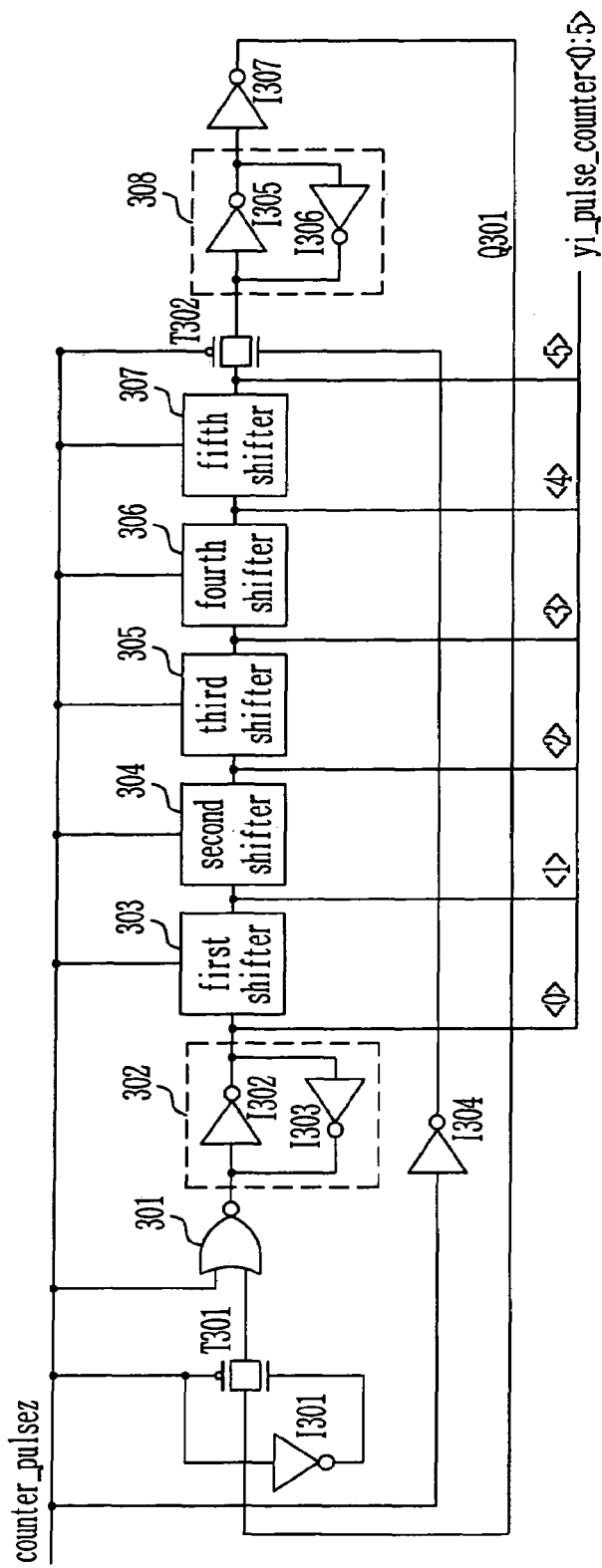
FIG. 4 is a circuit diagram of a pulse counter circuit comprising a circuit of controlling a pulse width according to an embodiment of the present invention.

FIG. 4 is a circuit diagram illustrating a pulse counter circuit comprising the circuit of controlling the pulse width according to the present invention, which will be described as follows.

A first inverter I301 inverts the counter pulse counter_pulsez. A first transmission gate T301 driven by the counter pulse counter_pulsez and an output signal of the first inverter I301 transfers a signal for a potential of a first node Q301. A NOR gate 301 logically combines the counter pulse counter_pulsez and the signal transferred through the first transmission gate T301. A first latch 302 comprised of second and third inverters I302, I303 latches an output signal of the NOR gate 301. First to fifth shifters 303 to 307 shift an output signal of the first latch 302, and output second to sixth pulse counter signals yi_pulse_counter<1:5>, sequentially, whenever the counter pulse counter_pulsez is enabled. It will be described about a detailed scheme and a method of driving the shifters with reference to FIG. 4. A second transmission gate T302 is driven by the counter pulse counter_pulsez and a signal inverting the counter pulse counter_pulsez through a fourth inverter I304, to transfer an output signal of a fifth inverter I305. A second latch 308 comprised of fifth and sixth inverters I305, I306 latches a signal transferred through the second transmission gate T302. An output signal of the second latch 308 is inverted through a seventh inverter I307, and then becomes a potential of the first node Q301.

In the pulse counter circuit constructed as above, a first pulse counter signal yi_pulse_counter<0> is outputted at the beginning state, and second to sixth pulse counter signals yi_pulse_counter<1:5> are outputted in sequence by sequentially driving the first to fifth shifters 303 to 307, whenever the counter pulse counter_pulsez is enabled. Moreover, the sixth pulse counter signal yi_pulse_counter<5>, which is an output signal of the fifth shifter 307, is transferred through the third transmission gate T302 and then latched to the second latch 308. Furthermore, the sixth pulse counter signal yi_pulse_counter<5> is inverted through the seventh inverter I307, and then becomes the potential of the first node Q301. The potential of the first node Q301 is transferred through the first transmission gate T301, to become an input of the NOR gate 301. That is, an output of the fifth shifter 307 is feedback and then becomes an input of the counter pulse circuit.

Figure 5:
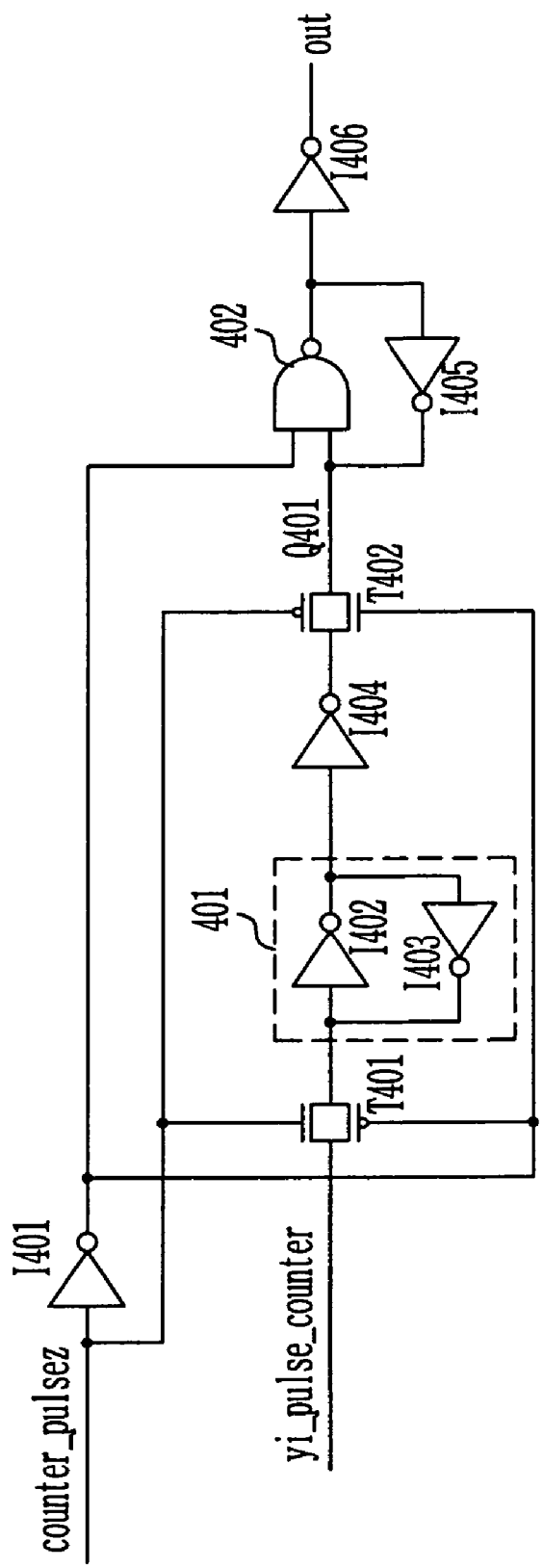
FIG. 5 is a circuit diagram of a shifter adapted to a pulse counter circuit of FIG. 4.

FIG. 5 is a circuit diagram of shifters of FIG. 4, which will be described as follows.

The counter pulse counter_pulsez is inverted by a first inverter I401. A first transmission gate T401 is driven by the counter pulse counter_pulsez and an output signal of the first inverter I401, to transfer the pulse counter signals yi_pulse_counter<0:5>. A signal transferred through the first transmission gate T401 is latched by a latch 401 comprised of second and third inverters I402, I403. An output signal of the latch 401 is inverted through a fourth inverter I404. A signal inverted through the fourth inverter I404 is transferred to a first node Q401 through the second transmission gate T402 driven by the counter pulse counter_pulsez and the output signal of the first inverter I401. The signal transferred through the second transmission gate T402 is inputted to a NAND gate 402 with the output signal of the first inverter I401. An output signal of the NAND gate 402 is inverted through a fifth inverter I405, to be feedback to the first node Q401 and to be outputted by being inverted through a sixth inverter I406.

It will now be described about a method of driving the shifters, constructed as above.

If the pulse clk_yi synchronized with the clock and the target pulse target_yi are applied to the same phases and then the counter pulse counter_pulsez is applied to a high state, the first inverter I401 inverts the two signals and outputs low state signals. The first transmission gate T401 is turned on by the counter pulse counter_pulsez and the output signal of the first inverter I401, to transfer the pulse counter signals yi_pulse_counter<0:5>. The pulse counter signals yi_pulse_counter<0:5> transferred through the first transmission gate T401 are latched by the latch 401 and the fourth inverter I404 inverts the output signal of the latch 401.

However, as the second transmission gate T402 maintains a turn-off state, data of the latch 401 is not transferred. Accordingly, the output signal of the first inverter I401 of a low state is inverted to a high state through the NAND gate 402 and then outputted. The output signal of the NAND gate 402 is inverted to a low state, to be outputted to an output terminal out.

The pulse clk_yi synchronized with the clock and the target pulse target_yi are applied to the different phases and then the counter pulse counter_pulsez is applied to a low state, the first inverter I401 inverts it, to output a high state signal. As the first transmission gate T401 is turned off according to the counter pulse counter_pulsez and the output signal of the first inverter I401, the pulse counter signals yi_pulse_counter<0:5> are not transferred. However, the second transmission gate T402 is turned on, to transfer the data before being latched in the latch 401 by inverting through the fourth inverter I404. As a result, the high state output signal of the first inverter I401 and the signal transferred through the second transmission gate T402 are inputted into the NAND gate 402, and the NAND gate 402 outputs a low state signal. The output signal of the NAND gate 402 outputted in a low state is inverted to a high state through the fifth inverter I405, to be feedback to the first node Q401, and then inverted to a high state through the sixth inverter I406, to be outputted to an output terminal out.

Figure 6:
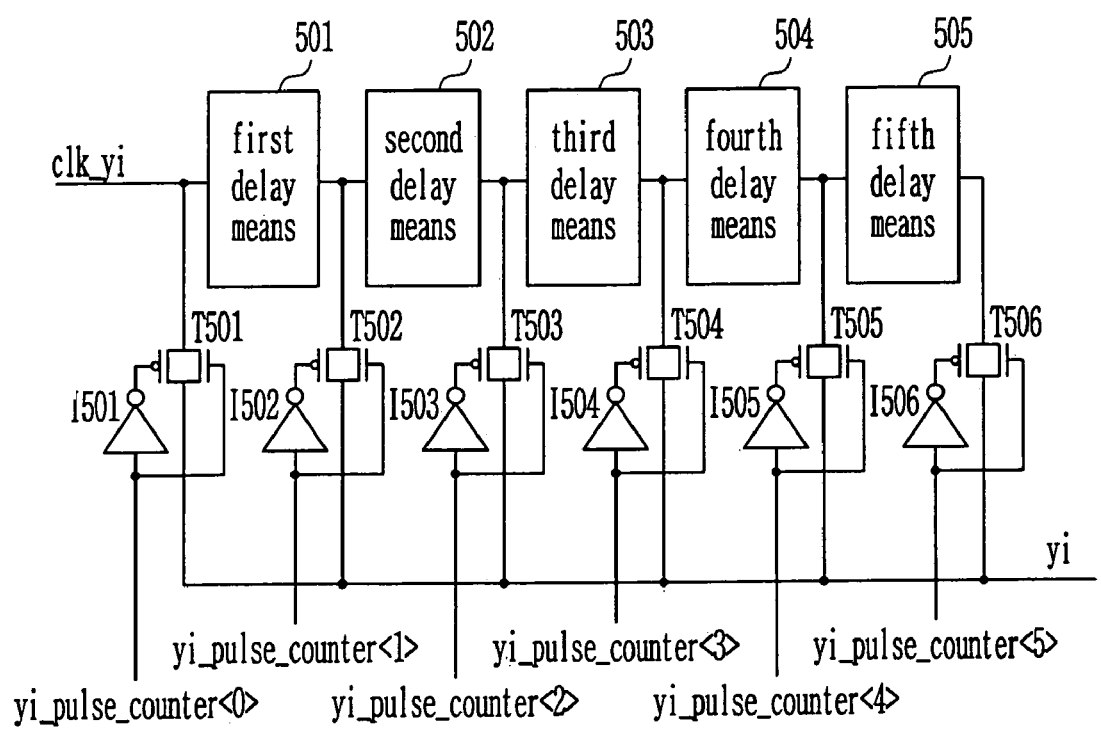
FIG. 6 is a circuit diagram of a pulse width adjustment circuit comprising a circuit of controlling a pulse width according to an embodiment of the present invention.

FIG. 6 is a circuit diagram of a pulse width adjustment circuit comprising the circuit of controlling the pulse width in accordance with the present invention.

The pulse width adjustment circuit of the present invention is comprised of: a plurality of delay means 501 to 505 for delaying the pulse clk_yi synchronized with the clock by connecting in series; and transmission gates T501 to T506, as a plurality of switching means, for setting a delay path by being driven according to each of the pulse counter signals yi_pulse_counter<0:5> and each of the pulse counter signals yi_pulse_counter<0:5 through inverters I501 to I506.

The pulse width adjustment circuit controls a pulse width of the output signal out by setting the delay path according to the pulse counter signals yi_pulse_counter<0:5>. For instance, assuming that the third pulse counter signal yi_pulse_counter<2> is applied to a high state and the other signals are applied to a low state, the third transmission gate T503 is turned on by the third pulse counter signal yi_pulse_counter<2> applied to a high state and a signal inverted to a low state by the third inverter I503. As a result, the pulse synchronized with the clock is delayed through the first and second delay means 501, 502 and the delayed signal is outputted as an output signal yi.

As described earlier, in order not to read and write a wrong data generated because a pulse width synchronized with the clock in a high frequency is narrowed, by setting a target pulse width in an optional frequency, counting until a pulse width synchronized with a clock and the target pulse width become identical each other, and then identifying the pulse width synchronized with the clock to the target pulse width with a delay as long as the counted time, the present invention guarantees stabilized read and write operations and a precharging time of a local input/output line so that the present invention is advantageous to remove failure which can be generated in an operation of high frequency DRAM or DDR.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A circuit for controlling a pulse width, comprising:
   a phase comparator for comparing a target pulse with an input pulse, the input pulse being synchronized with a clock, the phase comparator adapted to output a comparison signal;
   a counter pulse generation circuit for generating a counter pulse according to the comparison signal;
   a pulse counter circuit for outputting a plurality of pulse counter signals in sequence according to the counter pulse; and
   a pulse delay circuit for adjusting a delay time of the input pulse according to the plurality of pulse counter signals.

2. The circuit of claim 1, wherein the phase comparator includes:
   a logical means receiving the target pulse and the input pulse for detecting whether the target pulse is identical to the input pulse or not; and
   a driver for outputting the comparison signal according to an output of the detection unit.

3. The circuit of claim 2, wherein the logical means is an exclusive OR gate.

4. The circuit of claim 3, wherein the logical means further includes a latch for latching an output of the exclusive OR gate.

5. The circuit of claim 3, wherein the driver includes:
   a NAND gate for inputting the output of the logical means and a potential for a supply voltage;
   a first transmission gate for transferring an output of the NAND gate according to the output of the logical means; and
   a second transmission gate for transferring the output of the logical means according to the output of the detection unit.

6. The circuit of claim 1, wherein the counter pulse generation circuit includes:
   a delay means for delaying the comparison signal; and
   a NAND gate for generating the counter pulse by inputting the comparison signal and an output of the delay means.

7. The circuit of claim 1, wherein the pulse counter circuit includes a plurality of shifters, outputs a pulse counter signal without passing through a shifter at the beginning state, and outputs a plurality of pulse counter signals in sequence by driving the plurality of shifters in sequence whenever the counter pulse is enabled.

8. The circuit of claim 1, wherein the pulse counter circuit feedbacks the last pulse counter signal outputted through the last shifter to an input terminal of the pulse counter.

9. The circuit of claim 8, wherein the shifters include:
   a first transmission gate for transferring the pulse counter signal according to the counter pulse;
   a latch for latching a signal transferred through the first transmission gate;
   a second transmission gate for transferring an output signal of the latch according to the counter pulse; and
   a NAND gate for inputting the counter pulse and a signal transferred through the second transmission gate.

10. The circuit of claim 1, wherein the pulse counter circuit includes:
    a first transmission gate for transferring a potential of an input node according to the counter pulse;

a NOR gate for inputting the counter pulse and a signal transferred through the first transmission gate;

a first latch for outputting the pulse counter signal by latching an output signal of the NOR gate;

a plurality of shifters for shifting the pulse counter signal outputted from the first latch, and outputting a plurality of pulse counter signal in sequence by being driven in sequence whenever the counter pulse is enabled;

a second transmission gate for transferring the pulse counter signal outputted from the last shifter according to the counter pulse; and a second latch for deciding a potential of an input node by latching the pulse counter signal transferred through the second transmission gate.

11. The circuit of claim 1, wherein the pulse delay circuit includes:

a plurality of delay means for delaying the input pulse; and a plurality of switching means for setting a delay time by being connected to output terminals of the plurality of delay means, respectively, and driven according to the pulse counter signal.

12. The circuit of claim 11, wherein the switching means include:

a plurality of inverters for inverting the plurality of pulse counter signals, respectively; and a plurality of transmission gates driven by the plurality of pulse counter signals and output signals of the plurality of inverters.

13. The circuit of claim 1, wherein the phase comparator generates the comparison signal when a level of the input pulse is in discord with that of the target pulse.

14. The circuit of claim 1, wherein the counter pulse generation delays the comparison signal and then generates the counter pulse using a delayed comparison signal and the comparison signal, wherein a pulse width of the counter pulse corresponds to a delay time of the comparison signal.

15. The circuit of claim 1, wherein the pulse counter circuit activates one of the pulse counter signals in sequence whenever the counter pulse is generated.

16. The circuit of claim 15, wherein the pulse delay circuit has a plurality of delay paths having different delay times, and activates one of the delay paths in response to an activated pulse counter signal.

17. A method for controlling a delay time of a pulse, comprising the steps of:

(a) generating a comparison signal by comparing a target pulse having an appropriate width for an optional frequency with an input pulse, the input pulse is synchronized with a clock;

(b) generating a predetermined counter pulse by using the comparison signal;

(c) generating a plurality of pulse counter signals in sequence according to the counter pulse; and (d) adjusting a delay time of the input pulse using one of a plurality of delay paths having different delay times according to the plurality of pulse counter signals.

18. The method of claim 17, wherein the comparison signal is generated when a level of the input pulse is in discord with that of the target pulse.

19. The method of claim 17, wherein the predetermined counter pulse is generated by delaying the comparison signal and then generating the counter pulse using a delayed comparison signal and the comparison signal, wherein a pulse width of the counter pulse corresponds to a delay time of the comparison signal.

20. The method of claim 17, wherein one of the pulse counter signals is activated in sequence whenever the counter pulse is generated.

21. The method of claim 20, wherein the different delay path used to adjust the delay time of the input pulse, is selected by the activated pulse counter signal.

* * * * *